(12) United States Patent
Jang et al.

(10) Patent No.: US 7,118,937 B2
(45) Date of Patent: Oct. 10, 2006

(54) FABRICATION METHOD OF THIN-FILM TRANSISTOR ARRAY WITH SELF-ORGANIZED ORGANIC SEMICONDUCTOR

(75) Inventors: Jin Jang, #131 Advanced Display Research Center, Kyung Hee Univ., 1 Hoegi-dong, Dongdaemun-gu, Seoul, 130-701 (KR); Sung-Hwan Kim, Seoul (KR); Hye-Young Choi, Seoul (KR)

(73) Assignee: Jin Jang, Seoul (KR)

( * ) Notice: Subject to any disclaimer, the term of this patent is extended or adjusted under 35 U.S.C. 154(b) by 0 days.

(21) Appl. No.: 10/882,933

(22) Filed: Jul. 1, 2004

(65) Prior Publication Data

US 2005/0176185 A1 Aug. 11, 2005

(30) Foreign Application Priority Data

Feb. 10, 2004 (KR) ............. 10-2004-0008543

(51) Int. Cl.
*H01I 51/40* (2006.01)
(52) U.S. Cl. .............. 438/99; 438/149; 438/151; 438/158; 438/758; 438/216; 257/E21.703; 257/E21.413; 257/E51.007
(58) Field of Classification Search .......... 438/99, 438/151, 216, 30, 82, 149–164, 478; 257/E21.703, 257/E21.413
See application file for complete search history.

(56) References Cited

U.S. PATENT DOCUMENTS 5,107,308 A * 4/1992 Koezuka et al. ............ 257/40
6,413,790 B1 * 7/2002 Duthaler et al. ............ 438/21
6,433,359 B1 * 8/2002 Kelley et al. ............... 257/40
6,683,333 B1   1/2004 Kazlas et al.
6,734,038 B1 * 5/2004 Shtein et al. ............... 438/99
6,795,133 B1 * 9/2004 Deane ......................... 349/39
6,795,151 B1 * 9/2004 Lee .......................... 349/141
6,808,972 B1 * 10/2004 Sirringhaus et al. ....... 438/200
6,828,582 B1 * 12/2004 Ando et al. ................. 257/40
6,905,906 B1 * 6/2005 Sirringhaus et al. ........ 438/99
6,972,261 B1 * 12/2005 Wong et al. ............... 438/706
2003/0060038 A1 * 3/2003 Sirringhaus et al. ....... 438/637
2003/0156079 A1 * 8/2003 Nakanishi .................. 345/45
2005/0001968 A1 * 1/2005 Yamazaki et al. .......... 349/152
2005/0151820 A1 * 7/2005 Sirringhaus et al. ....... 347/107

* cited by examiner

*Primary Examiner*—B. William Baumeister
*Assistant Examiner*—Igwe U. Anya
(74) *Attorney, Agent, or Firm*—Morgan & Finnegan LLP

(57) ABSTRACT

The present invention relates to a method of selectively depositing an organic semiconductor material and a method of manufacturing an organic semiconductor thin film transistor array. Since the thin film transistor array is formed by locally performing a plasma process on a substrate before depositing an organic semiconductor active layer on the substrate, the organic semiconductor material is deposited on only the organic semiconductor active layer having an island shape. Therefore, it is not necessary to use a shadow mask method or a photolithography method to manufacture an active matrix array. Accordingly, the present invention has advantages in that it is possible to obtain a high resolution thin film transistor array and to prevent characteristics of the thin film transistors in the array from being deteriorated.

13 Claims, 13 Drawing Sheets

PVP 26.6°

IZO 61.4°

FABRICATION METHOD OF THIN-FILM TRANSISTOR ARRAY WITH SELF-ORGANIZED ORGANIC SEMICONDUCTOR

TECHNICAL FIELD

The present invention relates to a method of selectively depositing an organic semiconductor material and a method of manufacturing an organic semiconductor thin film transistor array.

Particularly, the present invention relates to a method of manufacturing an organic semiconductor thin film transistor array by performing a surface treatment on a substrate and selectively depositing an organic semiconductor material on a predetermined active region without using photolithography thereby not deteriorating characteristics of the thin film transistor.

More particularly, the present invention relates to a method of manufacturing a high-performance and high-resolution organic semiconductor thin film transistor array by using selectively depositing an organic semiconductor material without using a shadow mask.

Conventional organic semiconductor thin film transistors are mainly classified into an inverted-staggered type and an inverted-coplanar type. These types are developed in order to prevent an organic semiconductor thin film from damage during a series of film formation processes after the organic semiconductor thin film is formed. Now, the conventional organic semiconductor thin film transistors will be described in detail.

(Method of Manufacturing an Inverted-Staggered Thin Film Transistor)

FIG. 1 is a cross sectional view of a conventional inverted-staggered organic semiconductor transistor.

Referring to FIG. 1, a gate electrode 12a and a lower common electrode 12b are separated from each other and formed on an insulating substrate 11. A gate insulating film 13 is deposited over the gate electrode 12a and the lower common electrode 12b.

An organic semiconductor active layer 14 having an island shape is formed on the insulating film 13 by using a shadow mask. Source and drain electrodes 15a and 15b are formed on the organic semiconductor active layer 14 by using a shadow mask. Protective insulating films 16a and 16b are deposited to cover the gate insulating film 13 and the source and drain electrodes 15a and 15b, respectively. A pixel electrode 17 is formed on the protective insulating films 16a and 16b to connect with the drain electrode 15b.

The gate electrode 12a and other adjacent gate electrodes are commonly connected to each other. Capacitances are formed between the gate electrode 12a and the pixel electrode 17 and between the gate electrode 12a and the lower common electrode 12b.

In the conventional inverted-staggered organic semiconductor thin film transistor array, since the organic semiconductor active layer 14, the source electrode 15a, and the drain electrode 15b are formed by using the shadow mask, it is possible to minimize damage on the organic semiconductor active layer 14 due to an organic solvent or a chemical.

However, there are problems in that it is difficult to accurately align the shadow mask and to obtain a high-resolution thin film transistor array.

In addition, there are problems in that it is difficult to accurately define widths and lengths of the source and drain electrodes.

(Method of Manufacturing an Inverted-Coplanar Thin Film Transistor)

FIG. 2 is a cross sectional view of a conventional coplanar organic semiconductor thin film transistor.

As shown in FIG. 2, an insulating substrate 21, a gate electrode 22a, a lower common electrode 22b, and a gate insulating film 23 of the conventional coplanar organic semiconductor thin film transistor has the same structure as those of the conventional inverted-staggered organic semiconductor thin film transistor.

Protective insulating films 26a and 26b are deposited over the gate insulating film 23. A source electrode 24a and a drain electrode 24b are formed on the gate insulating film 23 by using a photolithography process. An organic semiconductor active layer 25 having an island shape is formed. The source electrode 24a, the drain electrode 24b, and the organic semiconductor active layer 25 are covered with the protective insulating film 26a. A pixel electrode 27 is formed to connect with the drain electrode 24b on the protective insulating films 26a and 26b.

Similar to the inverted-staggered organic semiconductor thin film transistor, the gate electrode 22a and other adjacent gate electrodes are commonly connected to each other. Capacitances are formed between the gate electrode 22a and the pixel electrode 27 and between the gate electrode 22a and the lower common electrode 22b.

Since the source and drain electrodes 24a and 24b of the conventional coplanar organic semiconductor thin film transistor are formed by using the photolithography process, it is possible to obtain a high resolution organic semiconductor thin film transistor. However, the conventional coplanar organic semiconductor thin film transistor has a limitation with respect to its resolution according to a method of manufacturing an organic semiconductor active layer 25 on the source and drain electrodes 24a and 24b. The process for forming the organic semiconductor layer 25 is classified into two types. In the first type process, the island is formed by using a shadow mask similar to the inverted-staggered organic semiconductor thin film transistor. In the second type process, the island is formed by depositing organic semiconductor active layer 25 and performing a photolithography process.

The first type process has a problem in that it is difficult to obtain a high resolution thin film transistor array. The second type process has a problem in that the organic semiconductor active layer is vulnerable to an organic solvent or a chemical and characteristics of the thin film transistor array are deteriorated.

An approach for preventing an organic semiconductor active layer 25 from damage due to an organic solvent is developed in researchers at Penn. State Univ., USA. In the approach, photosensitive polyvinyl alcohol (PVA) soluble in water is used to pattern the organic semiconductor active layer in the organic semiconductor thin film transistor array. Unfortunately, since the polyvinyl alcohol is vulnerable to moisture, the organic semiconductor active layer has a bad stability with respect to moisture. In addition, characteristics of the organic semiconductor active layer may be deteriorated due to plasma during dry etching process.

SUMMARY OF THE INVENTION

In order to solve the above mentioned problems, an object of the present invention is to provide a method of manufacturing an organic semiconductor thin film transistor array by performing a surface treatment on a substrate and selectively depositing an organic semiconductor material on a predetermined active region without using photolithography thereby not deteriorating characteristics of the thin film transistor.

Another object of the present invention is to provide a method of manufacturing a high-resolution organic semiconductor thin film transistor array by using selectively depositing an organic semiconductor material without using a shadow mask.

Another object of the present invention is to provide a method of manufacturing a thin film transistor array by depositing an organic semiconductor active layer on desired regions of a substrate through a plasma treatment process.

Another object of the present invention is to provide a method of manufacturing an organic semiconductor thin film transistor array by using selectively depositing an organic semiconductor material and forming two-layered protective insulating films for protecting an organic semiconductor active layer, thereby securing stability of the organic semiconductor thin film transistor array.

Another object of the present invention is to provide a method of manufacturing an organic semiconductor thin film transistor array by using selectively depositing an organic semiconductor material and forming a pixel electrode on an organic gate insulating film, thereby minimizing processes after forming an organic semiconductor active layer.

Another object of the present invention is to provide a method of manufacturing an organic semiconductor thin film transistor array by using selectively depositing an organic semiconductor material and forming a pixel electrode on an organic gate insulating film, thereby obtaining a large capacitance compared to a conventional one.

In order to achieve the object, the present invention provides a method of manufacturing a thin film transistor array comprising switching thin film transistors, pixel electrodes, and connecting elements connecting the switching thin film transistors and the pixel electrodes, the method comprising steps of forming gate lines on a substrate; forming gate insulating film to cover the gate lines formed on the substrate; forming source and drain electrodes on the gate insulating film; forming organic semiconductor islands by not using a mask on the gate insulating film where the source and drain electrodes are formed;

forming a protective film to cover the organic semiconductor island; and forming a contact hole though the protective film.

In addition, the gate lines may be made of aluminum or aluminum alloy.

In addition, the gate insulating film may be made of an organic material.

In addition, the organic material may be made of PVP (polyvinylphenol), BCB (benzocylobutene), or PI (polyimide).

In addition, each of the source and drain electrodes may have a two-layer structure, wherein the one layer is made of gold and the other layer is made of a metal other than the gold.

In addition, the metal other than the gold may be chrome.

In addition, the method may further comprise a step of forming a pixel electrode on the gate insulating film.

In addition, the pixel electrode may be made of ITO (indium tin oxide), or IZO (indium zinc oxide).

In addition, the method may further comprise a step of maintaining temperature of the substrate in a range of 100 to 200° C., thereby selectively forming the organic semiconductor island on the source and drain electrodes.

In addition, the method may further comprise a step of performing a surface treatment on the substrate and selectively depositing organic semiconductor between the source and drain electrodes.

In addition, the step of performing the surface treatment may comprise steps of: performing a plasma process on the substrate; and forming a monolayer where a self-assembled monolayer is to be formed.

In addition, the monolayer may be OTS (octadecyltrichlorosilane).

In addition, the organic semiconductor island may be made of pantacene.

In addition, the method may further comprise a step of forming an organic semiconductor film or an organic insulating film as a protective layer on the organic thin film.

In addition, the organic semiconductor film or the organic insulating film may be formed by using a selective photolithography process.

In addition, the method may further comprise a step of forming a secondary protective insulating film on the organic semiconductor film or the organic insulating film.

In addition, the secondary protective insulating film may be an organic or inorganic insulating film.

BRIEF DESCRIPTION OF THE DRAWINGS

The above and other objects, advantages and features of the present invention will become apparent from the following description of preferred embodiments given in conjunction with the accompanying drawings, in which.

BEST MODE FOR CARRYING OUT THE INVENTION

Now, the preferred embodiments according to the present invention will be described in details with reference to the accompanying drawings.

(Embodiment 1)

Figure 1:
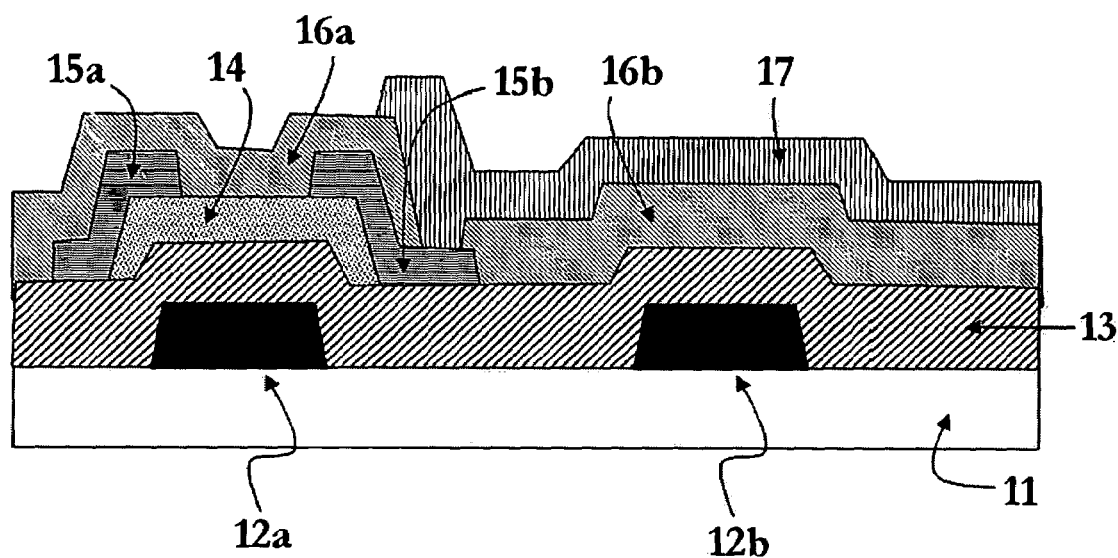
FIG. 1 is a cross sectional view of a conventional inverted-staggered organic semiconductor transistor.
Figure 2:
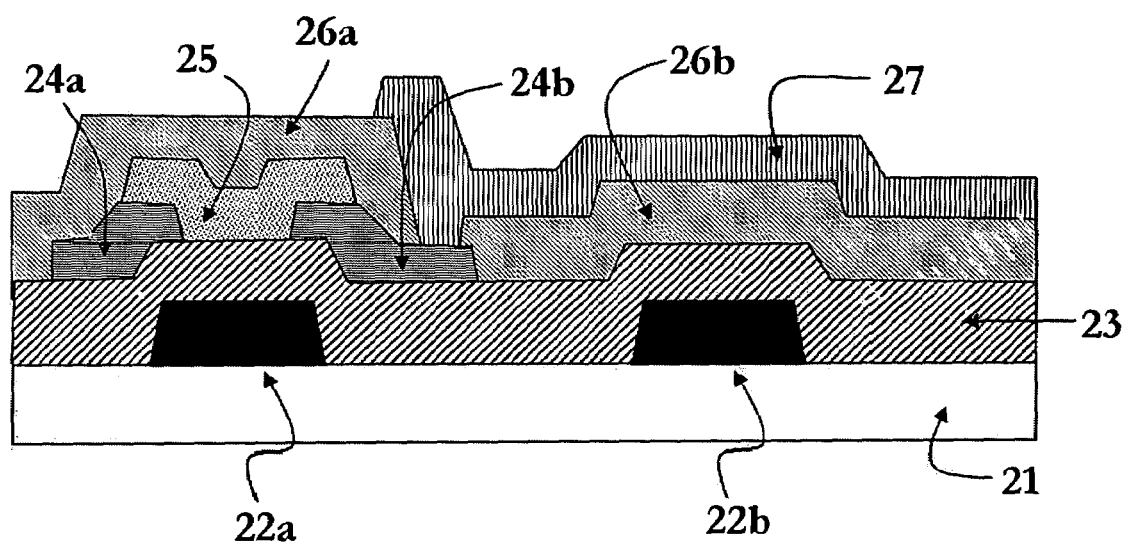
FIG. 2 is a cross sectional view of a conventional inverted-coplanar organic semiconductor thin film transistor.
Figure 3:
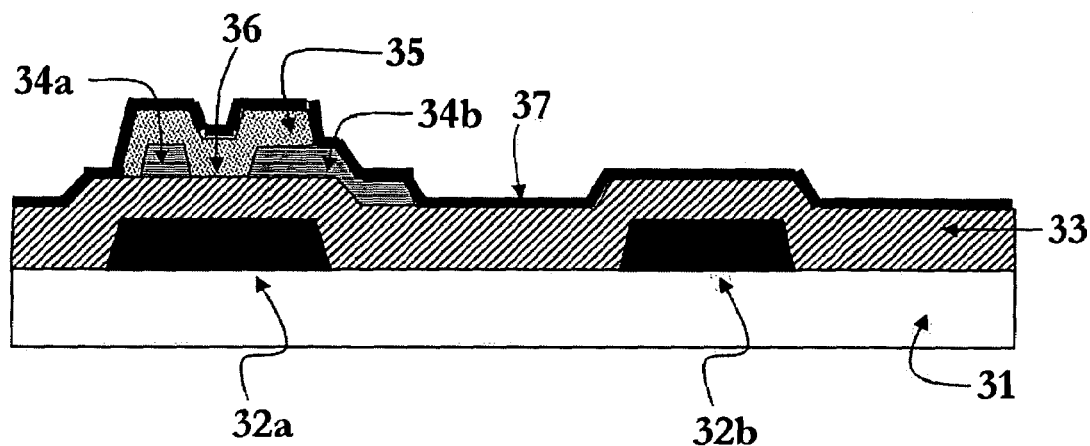
FIG. 3 is a cross sectional view of a thin film transistor subjected to an oxygen plasma process of a method of manufacturing a thin film transistor array according to Embodiment 1 of the present invention.
Figure 4:
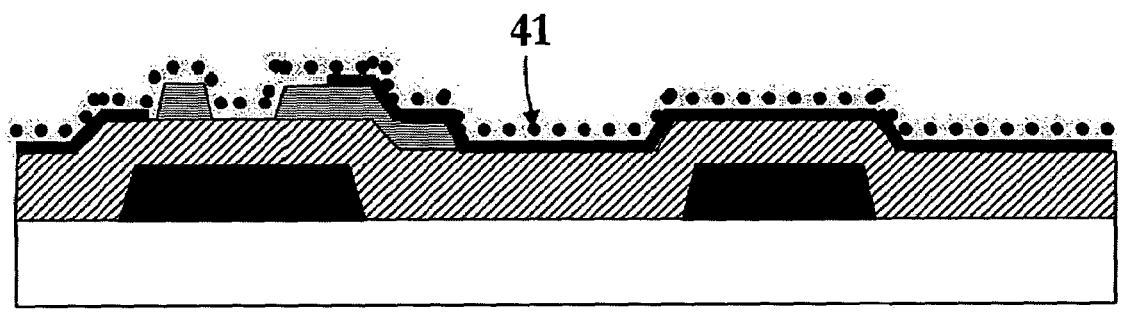
FIG. 4 is a cross sectional view of a thin film transistor subjected to a self-assembled monolayer process according to Embodiment 1 of the present invention.
Figure 6:
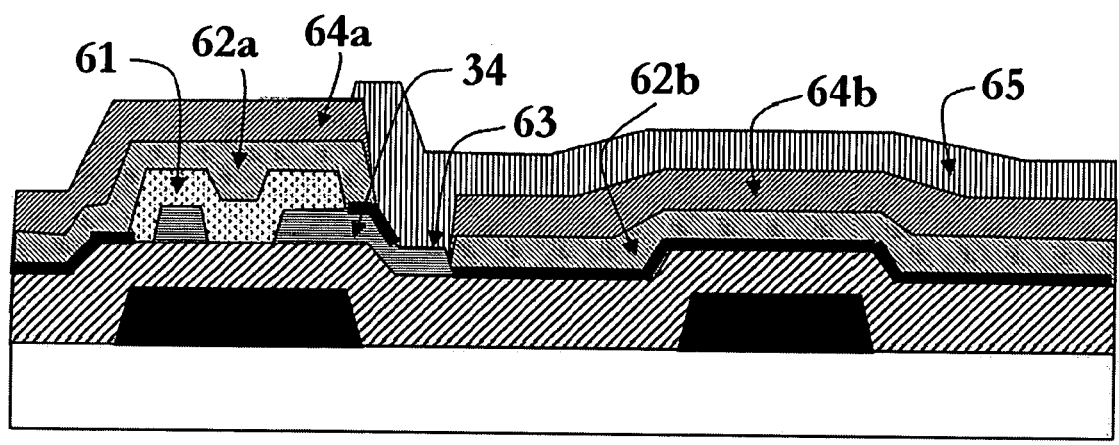
FIG. 6 is a cross sectional view of a thin film transistor obtained according to Embodiment 1 of the present invention.

FIG. 3 is a cross sectional view of a thin film transistor subjected to an oxygen plasma process of a method of manufacturing a thin film transistor array according to Embodiment 1 of the present invention. FIG. 4 is a cross sectional view of a thin film transistor subjected to a self-assembled monolayer process according to Embodiment 1 of the present invention. FIG. 6 is a cross sectional view of a thin film transistor obtained according to Embodiment 1 of the present invention.

As shown in FIGS. 3, 4 and 6, an organic semiconductor thin film transistor comprises a gate electrode 32a and a lower common electrode 32b which are formed on an insulating substrate 31. The gate electrode 32a and the lower common electrode 32b are separated from each other. The gate electrode 32a and the lower common electrode 32b are deposited to have a thickness of about 100 nm by using a DC or RF sputtering process and patterned by using a photolithography process.

An organic gate insulating film 33 having a thickness of 200 to 500 nm are formed to cover the gate electrode 32a and the lower common electrode 32b by using a spin coating process. Then, the organic insulating film 33 is cured at a temperature of about 180° C. A source electrode 34a and a drain electrode 34b are formed on the gate insulating film 33. The source electrode 34a and the drain electrode 34b are deposited to have a thickness of 50 to 200 nm by using the DC or RF sputtering process and patterned by using the photolithography process.

Before an organic semiconductor active layer is formed, plasma and chemical treatment processes are performed on the organic gate insulating film 33 and the source and drain electrodes 34a and 34b. The organic semiconductor active layer is made of pentacene. Before selectively depositing pantacene on a region between source and drain electrodes, a surface treatment process is performed on the substrate. Now, the surface treatment process will be described.

Firstly, photoresist 35 is formed to cover the source and drain electrodes 34a and 34b and channel region 36. An oxygen plasma 37 is treated on the substrate for about one minute by using a plasma equipment. Next, the photoresist 35 is removed by using a remover or a striper.

Next, the substrate is immersed in an OTS solution diluted with toluene in a 1:200 ratio of OTS to toluene during about 15 to 30 second. The substrate is rinsed with an isopropyl alcohol (IPA) solution. As a result, a self-assembled monolayer 41 is formed as shown in FIG. 4.

FIGS. 5a to 5k are optical microscopic pictures of a deionized water droplet on thin film surfaces having different conditions in order to show contact angles therebetween in Embodiment 1 of the present invention. In case of the thin film surface not being subjected to the oxygen plasma process, the contact angle of the deionized water droplet on the source and drain electrodes is about 60° (see FIG. 5a), and the contact angle of the deionized water droplet on the organic gate insulating film is about 27° (see FIG. 5g). In case of the thin film surface treated with the oxygen plasma process, the contact angle of the deionized water droplet on the source and drain electrodes is about 40° (see FIG. 5b), and the contact angle of the deionized water droplet on the organic gate insulating film is about 9° (see FIG. 5h).

Figure 5A:
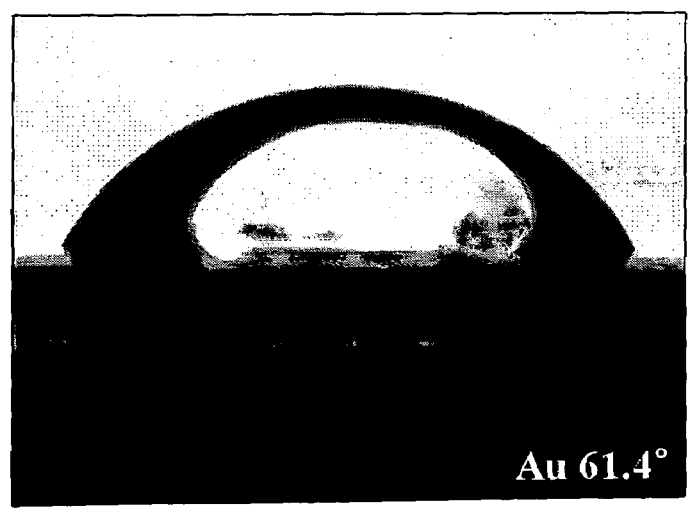
FIG. 5a is an optical microscopic picture of a deionized water droplet on a gold film in order to show a contact angle therebetween in Embodiment 1 of the present invention.
Figure 5B:
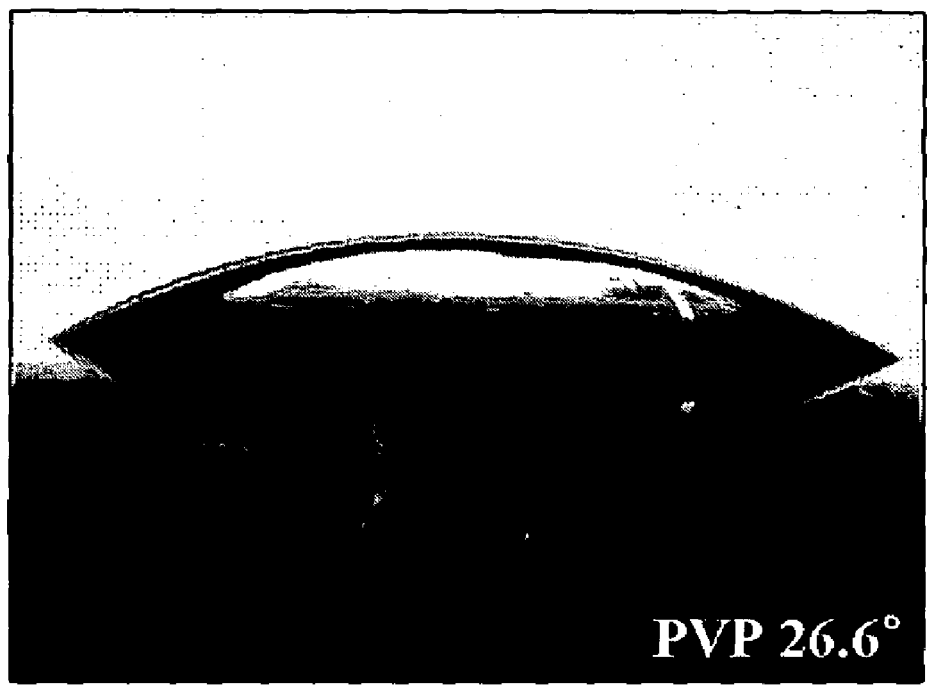
FIG. 5b is an optical microscopic picture of a deionized water droplet on an organic gate insulating film in order to show a contact angle therebetween in Embodiment 1 of the present invention.
Figure 5C:
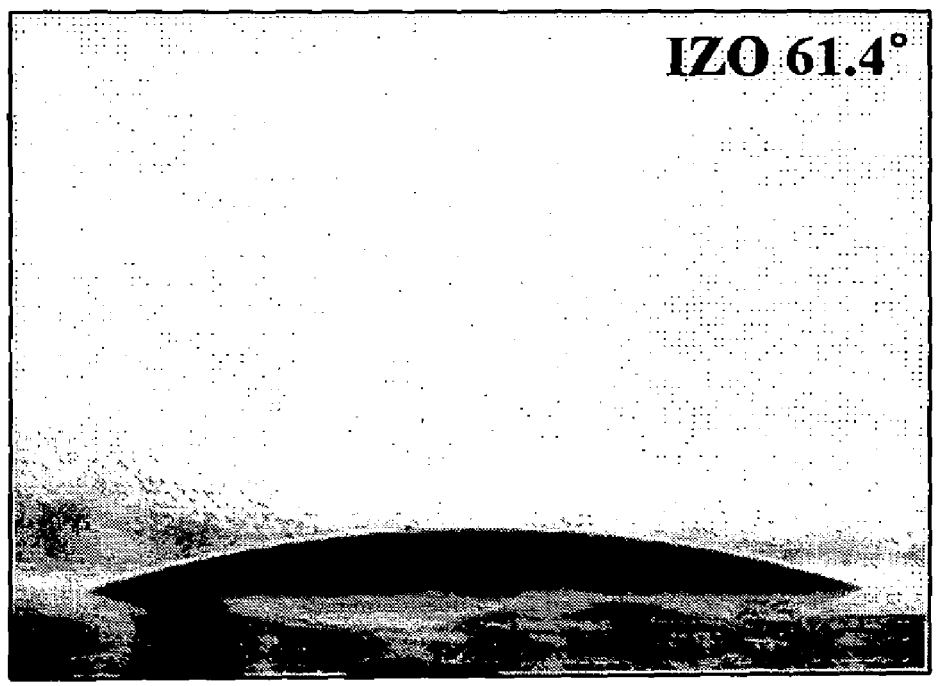
FIG. 5c is an optical microscopic picture of a deionized water droplet on an IZO film in order to show a contact angle therebetween in Embodiment 1 of the present invention.
Figure 5D:
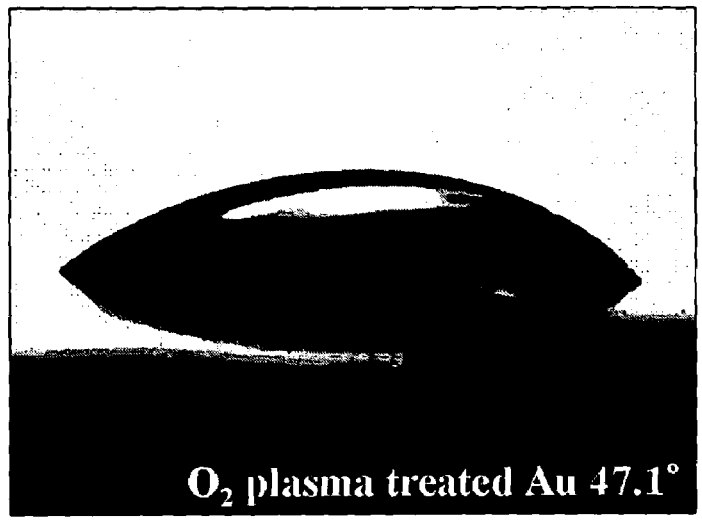
FIG. 5d is an optical microscopic picture of a deionized water droplet on a gold film subjected to an oxygen plasma process in order to show a contact angle therebetween in Embodiment 1 of the present invention.
Figure 5E:
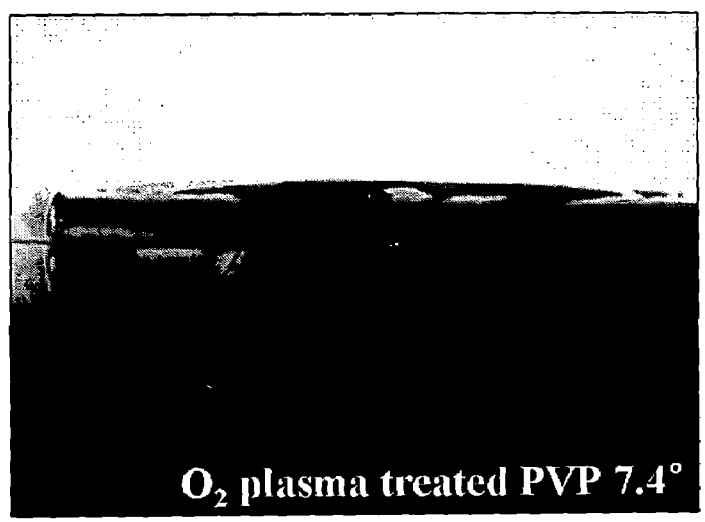
FIG. 5e is an optical microscopic picture of a deionized water droplet on an organic gate insulating film subjected to an oxygen plasma process in order to show a contact angle therebetween in Embodiment 1 of the present invention.
Figure 5F:
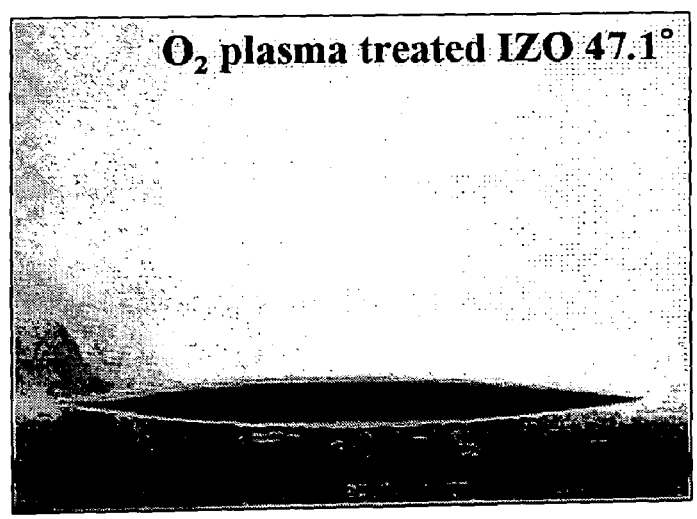
FIG. 5f is an optical microscopic picture of a deionized water droplet on an IZO film subjected to an oxygen plasma process in order to show a contact angle therebetween in Embodiment 1 of the present invention.
Figure 5G:
FIG. 5g is an optical microscopic picture of a deionized water droplet on a gold film subjected to an OTS (octadecyltrichlorosilane) process in order to show a contact angle therebetween in Embodiment 1 of the present invention.
Figure 5H:
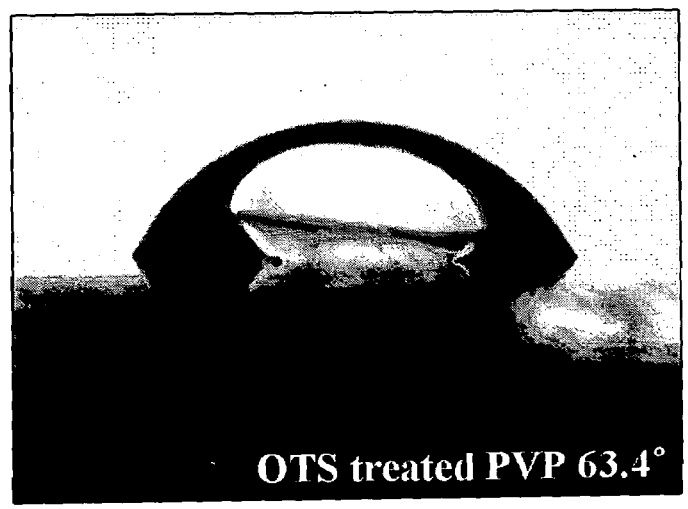
FIG. 5h is an optical microscopic picture of a deionized water droplet on an organic gate insulating film subjected to an OTS (octadecyltrichlorosilane) process in order to show a contact angle therebetween in Embodiment 1 of the present invention.
Figure 5I:
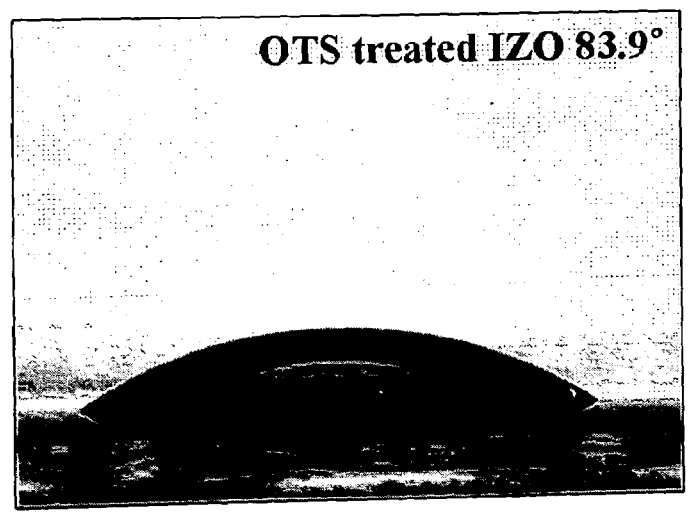
FIG. 5i is an optical microscopic picture of a deionized water droplet on an IZO film subjected to an OTS (octadecyltrichlorosilane) process in order to show a contact angle therebetween in Embodiment 1 of the present invention.
Figure 5J:
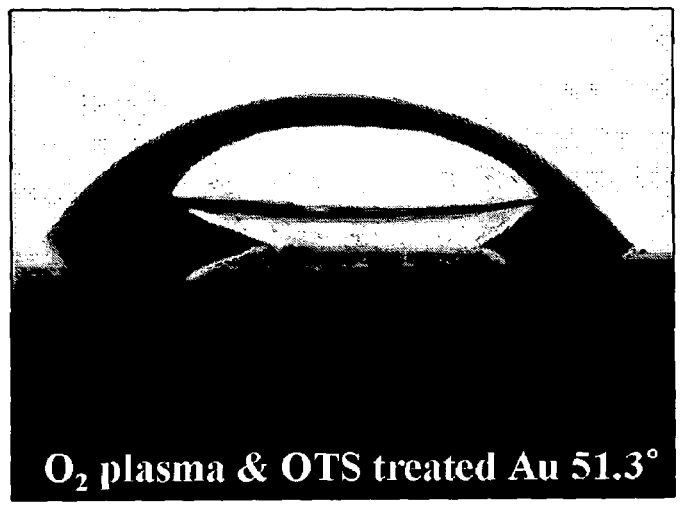
FIG. 5j is an optical microscopic picture of a deionized water droplet on a gold film subjected to an oxygen plasma processes and an OTS (octadecyltrichlorosilane) process in order to show a contact angle therebetween in Embodiment 1 of the present invention.

In case of the thin film surface being subjected to not the oxygen plasma process but the diluted OTS solution treatment process, the contact angle of the deionized water droplet on the source and drain electrode is about 84° (see FIG. 5d), and the contact angle of the deionized water droplet on the organic gate insulating film is about 63° (see FIG. 5j).

Figure 5K:
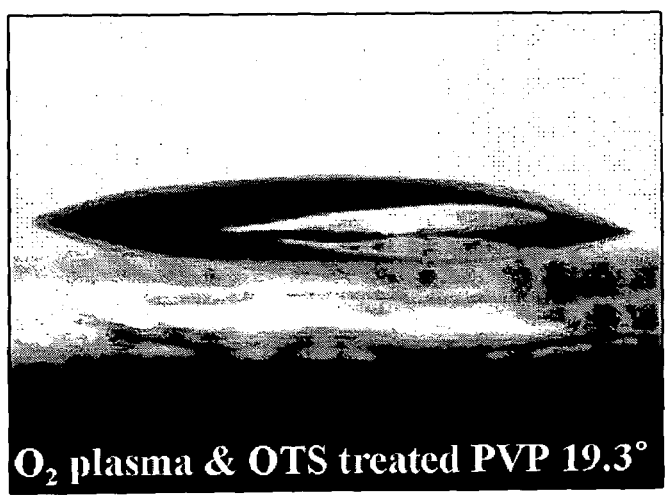
FIG. 5k is an optical microscopic picture of a deionized water droplet on an organic gate insulating film subjected to an oxygen plasma processes and an OTS (octadecyltrichlorosilane) process in order to show a contact angle therebetween in Embodiment 1 of the present invention.
Figure 5L:
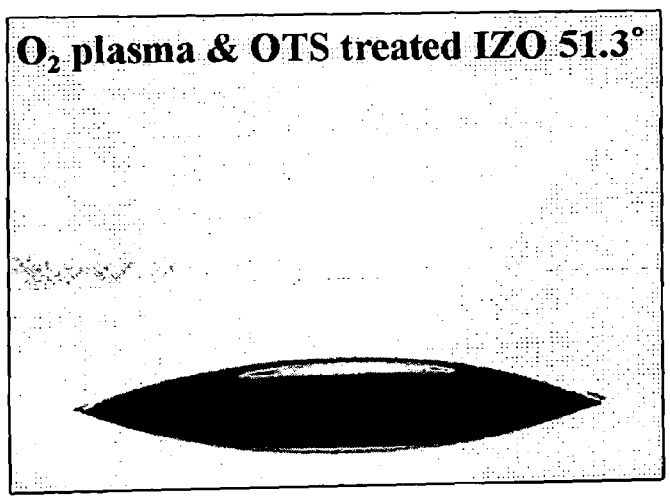
FIG. 5l is an optical microscopic picture of a deionized water droplet on an IZO film subjected to an oxygen plasma processes and an OTS (octadecyltrichlorosilane) process in order to show a contact angle therebetween in Embodiment 1 of the present invention.

In case of the thin film surface being subjected to the oxygen plasma process and the diluted OTS solution treatment process, the contact angle of the deionized water droplet on the source and drain electrode is about 55° (see FIG. 5*e*), and the contact angle of the deionized water droplet on the organic gate insulating film is about 29° (see FIG. 5*k*).

As described above, if the thin film surface is subjected to not the oxygen plasma process but the diluted OTS solution treatment process, the contact angles of the deionized water droplet on the source and drain electrodes 34*a* and 34*b* and on the organic gate insulating film channel 36 are about 84° (see FIG. 5*d*) and 63 ((see FIG. 5*j*), respectively. Therefore, the thin film surface has a hydrophobic property. On the contrary, if the thin film surface is subjected to the oxygen plasma process and the diluted OTS solution treatment process, the contact angles of the deionized water droplet on the organic gate insulating film is about 29 ((see FIG. 5*k*). Therefore, the thin film surface has a hydrophilic property.

FIG. 6 is a cross sectional view of a thin film transistor obtained according to Embodiment 1 of the present invention. Referring to FIG. 6, an organic semiconductor active layer 61, protective insulating films 62*a* and 62*b*, and pixel electrodes 65 are formed on a substrate of which surface is subjected to a surface treatment process. The organic semiconductor active layer 61 is deposited on the substrate by using an organic vapor phase deposition (OVPD) method.

Figure 7:
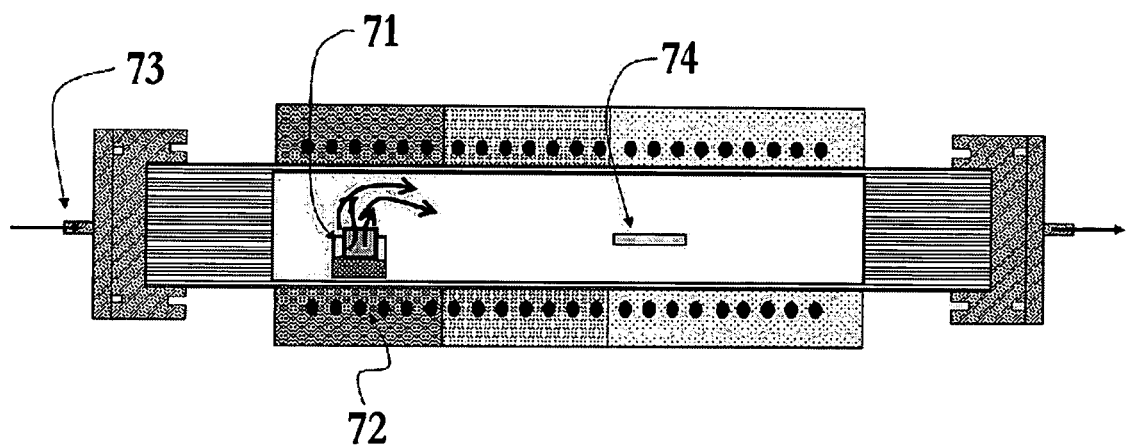
FIG. 7 is a cross sectional view of an organic vapor phase deposition apparatus for selectively depositing an organic semiconductor material according to the present invention.
Figure 8:
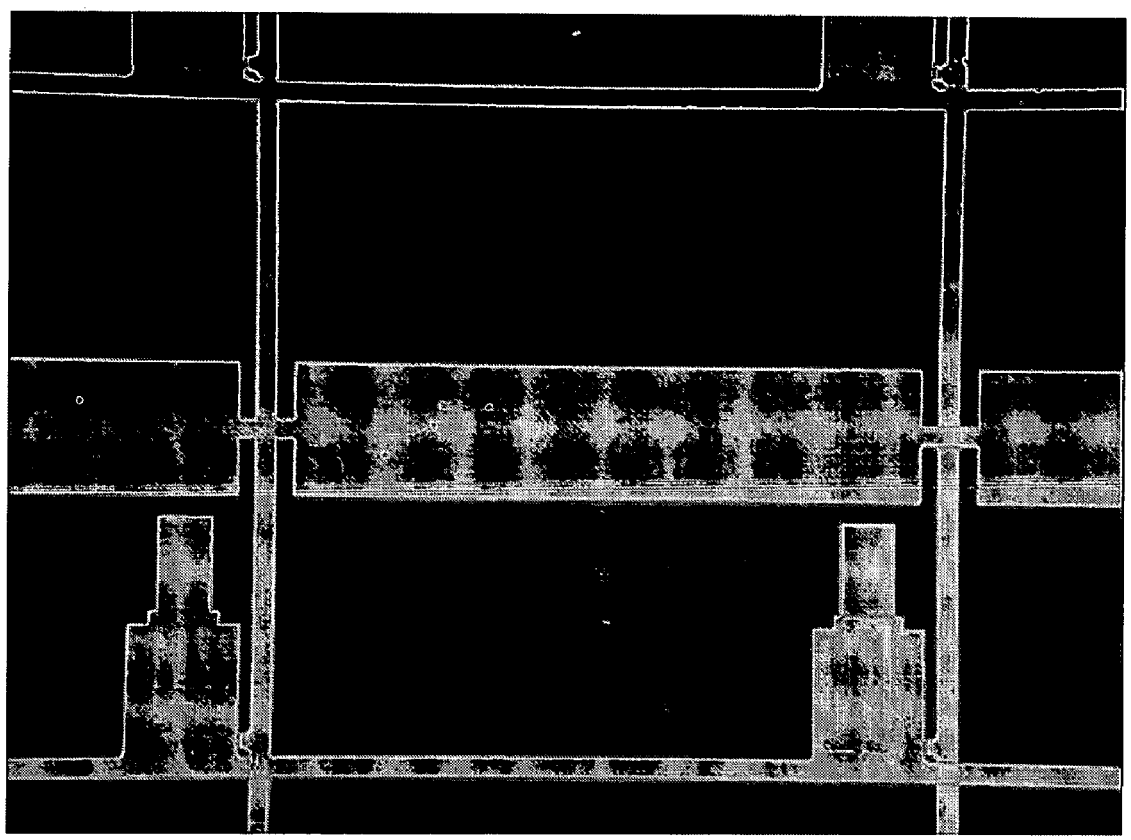
FIG. 8 is a structural view of an organic semiconductor thin film transistor array according to the present invention.

FIG. 7 is a cross sectional view of an organic vapor phase deposition apparatus for selectively depositing an organic semiconductor material according to the present invention. An organic semiconductor material 71 is evaporated by a heating process at a temperature of 285 (C in an evaporation unit 72. In a chamber of the evaporation unit 72, the organic semiconductor material 71 is heated at a high purity nitrogen ambience. The nitrogen is introduced into the chamber through a gas inlet 73. The partial pressure of the nitrogen is of about 2 Torr. The substrate where the semiconductor material is deposited is faced down. The temperature of the substrate 74 is maintained at about 100 to 200 (C. If the temperature of the substrate 74 is below 150 (C, the organic semiconductor active layer 61 is uniformly deposited on the entire substrate 74. On the contrary, if the temperature of the substrate is in a range of 150 to 200 (C, the organic semiconductor active layer 61 is selectively deposited on a desired region of the substrate 74.

Figure 9:
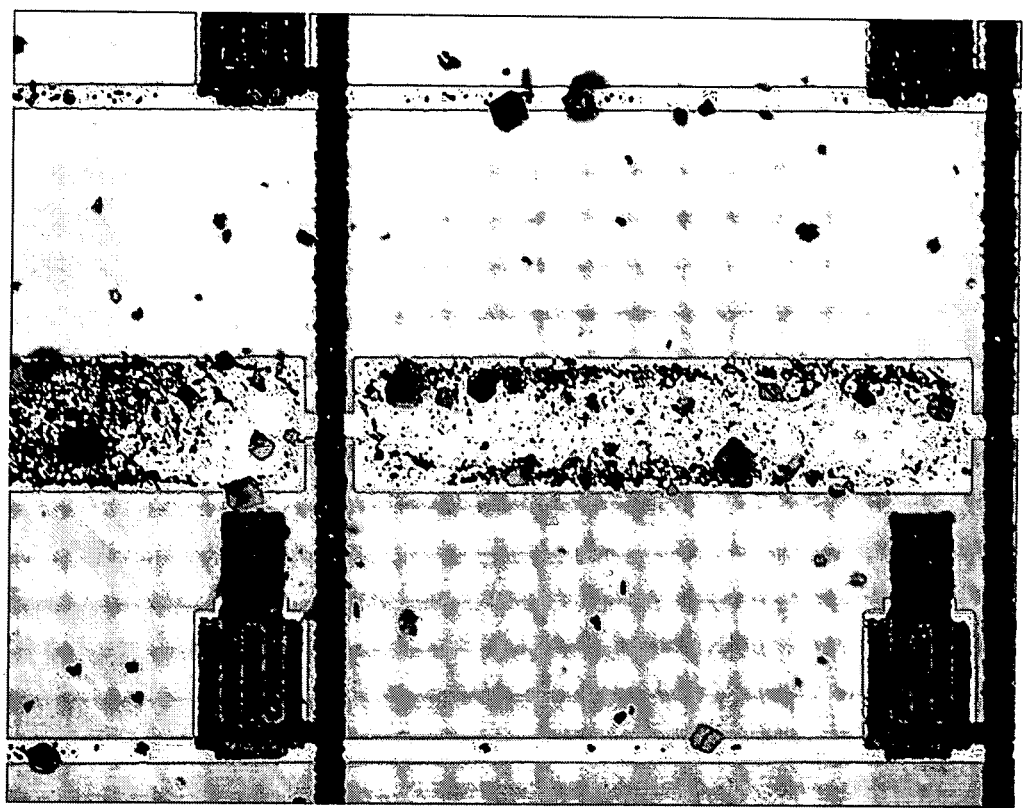
FIG. 9 is an optical microscopic picture of a thin film transistor array on which an organic semiconductor material is deposited.

FIG. 9 is an optical microscopic picture of a thin film transistor array on which an organic semiconductor material is deposited.

Since an organic semiconductor material deposited on the substrate 74 by using the organic vapor phase deposition method has a hydrophobic property, the organic semiconductor material is more effectively deposited on a hydrophobic surface having a large contact angle. Therefore, the organic semiconductor material has a tendency to extend toward the hydrophobic surface. As a result, the organic semiconductor film can be deposited on the only desired region which is subjected to a plasma treatment process and a diluted OTS solution treatment process. Similarly, the organic semiconductor film is formed on the organic insulating film where the source and drain electrode is not formed.

As shown in FIG. 6, the protective insulating films 62*a* and 62*b* are formed on the deposited organic semiconductor film. The protective insulating films 62*a* and 62*b* are made of PVA (polyvinyl alcohol), that is, an negative photosensitive insulating material. The protective insulating films 62*a* and 62*b* have a function of preventing the crystal structure of the organic semiconductor active layer 61 from being deteriorated.

The polyvinyl alcohol film is formed, as follows. Firstly, polyvinyl alcohol and ammonium dichromate are mixed in a ratio of 30:1 and dissolved in deionized water. The mixed solution of polyvinyl alcohol and ammonium dichromate is applied on the substrate by using a spin coating method in order to form the protective insulating films 62*a* and 62*b*. The protective insulating film 62*a* and 62*b* are dried in vacuum for one hour in order to remove the solvent, that is, the deionized water. The thickness of the protective insulating films 62*a* and 62*b* can be adjusted in accordance with amount of the deionized water. Typically, the thickness of the protective insulating films is about 1000 nm. In the next photolithography process, since the protective insulating films 62*a* and 62*b* serve as a negative photosensitive photoresist, a negative pattern is formed. Similar to the above mentioned method, via hole 63 is formed. The developer used in the photolithography method is deionized water.

Next, secondary protective insulating films 64*a* and 64*b* are formed on the protective insulating films 62*a* and 62*b*. The secondary protective insulating films 64*a* and 64*b* have a function of preventing moisture from being transferred to the protective insulating films 62*a* and 62*b*. The protective insulating films 62*a* and 62*b* are vulnerable to the moisture. The secondary protective insulating films 64*a* and 64*b* are made of photosensitive acrylic material, parylene, or an inorganic insulating material such as silicon dioxide and silicon nitride.

Referring to FIG. 6, the pixel electrode 65 is formed on the secondary protective insulating film 64. In order to form the pixel electrode 65, a metallic material, ITO, or IZO having a thickness of about 150 nm is deposited on the protective insulating films 64*a* and 64*b* by a DC or RF sputtering method and patterned by using a photolithograph method.

(Embodiment 2)

Figure 10:
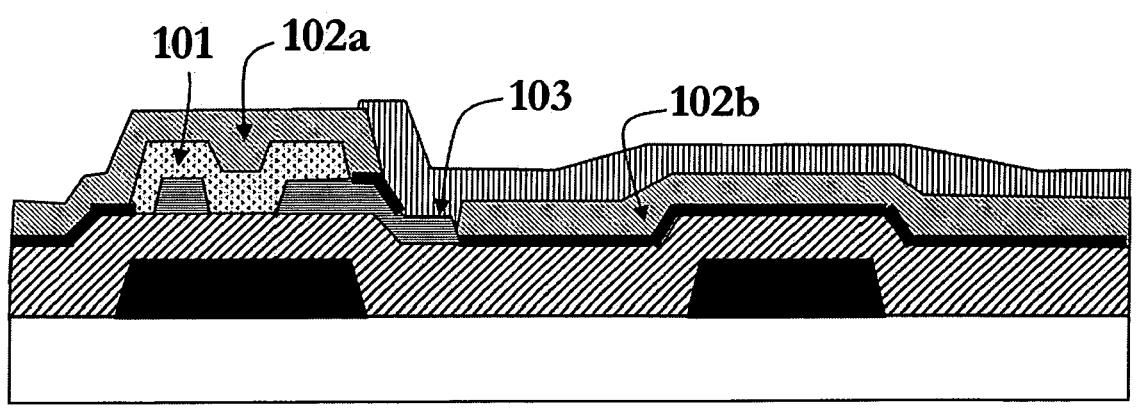
FIG. 10 is a cross sectional view of an organic semiconductor thin film transistor array according to Embodiment 2 of the present invention.

FIG. 10 is a cross sectional view of an organic semiconductor thin film transistor array according to Embodiment 2 of the present invention.

As shown in FIG. 10, in Embodiment 2, protective insulating films 102*a* and 102*b* are formed on an organic semiconductor actively layer 101 by using parylene, UV-cured bonding material, and negative photoresist. A via hole 103 is formed by using a photolithography method.

Since the other processes are the same as those of Embodiment 1, description thereof is omitted.

(Embodiment 3)

Figure 11:
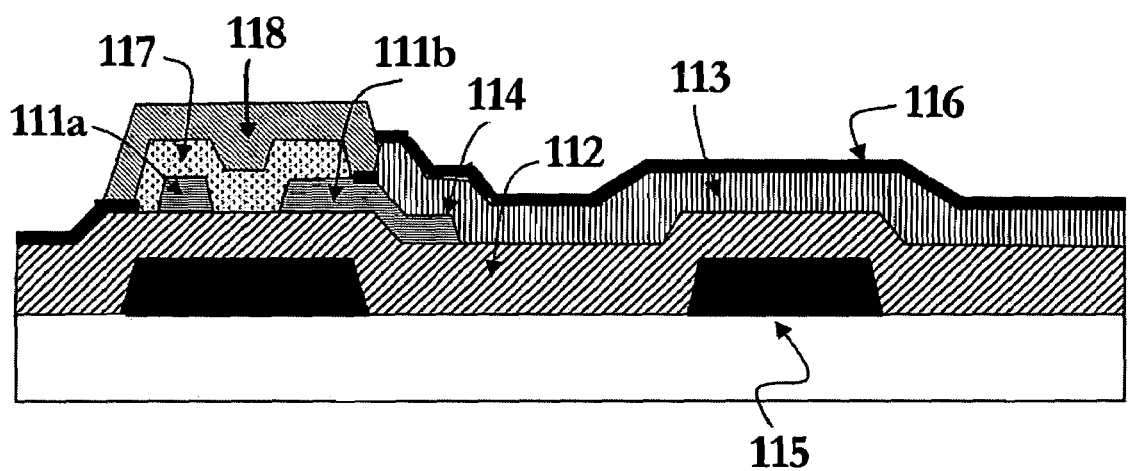
FIG. 11 is a cross sectional view of an organic semiconductor thin film transistor array according to Embodiment 3 of the present invention.

FIG. 11 is a cross sectional view of an organic semiconductor thin film transistor array according to Embodiment 3 of the present invention.

As shown in FIG. 11, in Embodiment 3, after source and drain electrodes 111*a* and 111*b* are formed, a pixel electrode is formed on the source and drain electrodes 111*a* and 111*b* and an organic gate insulating film 112. The drain 111*b* and the pixel electrode 113 are connected with each other without any via hole. Only the gate insulating film 112 is formed between the pixel electrode 113 and a lower common electrode 115. Therefore, according to Embodiment 2 of the present invention, it is possible to obtain an organic semiconductor thin film transistor array having larger capacitance than a conventional one.

With similar methods in Embodiment 1, the oxygen plasma process is locally performed by using photoresist to obtain a film 116. Next, the substrate is subjected to a diluted OTS solution treatment process. An organic semiconductor active layer 117 is selectively formed on the substrate. With a similar method of Embodiments 1 and 2, upper protective insulating film 118 is formed over the organic semiconductor active layer 117.

Since the other processes are the same as those of Embodiment 1, description thereof is omitted.

Figure 12:
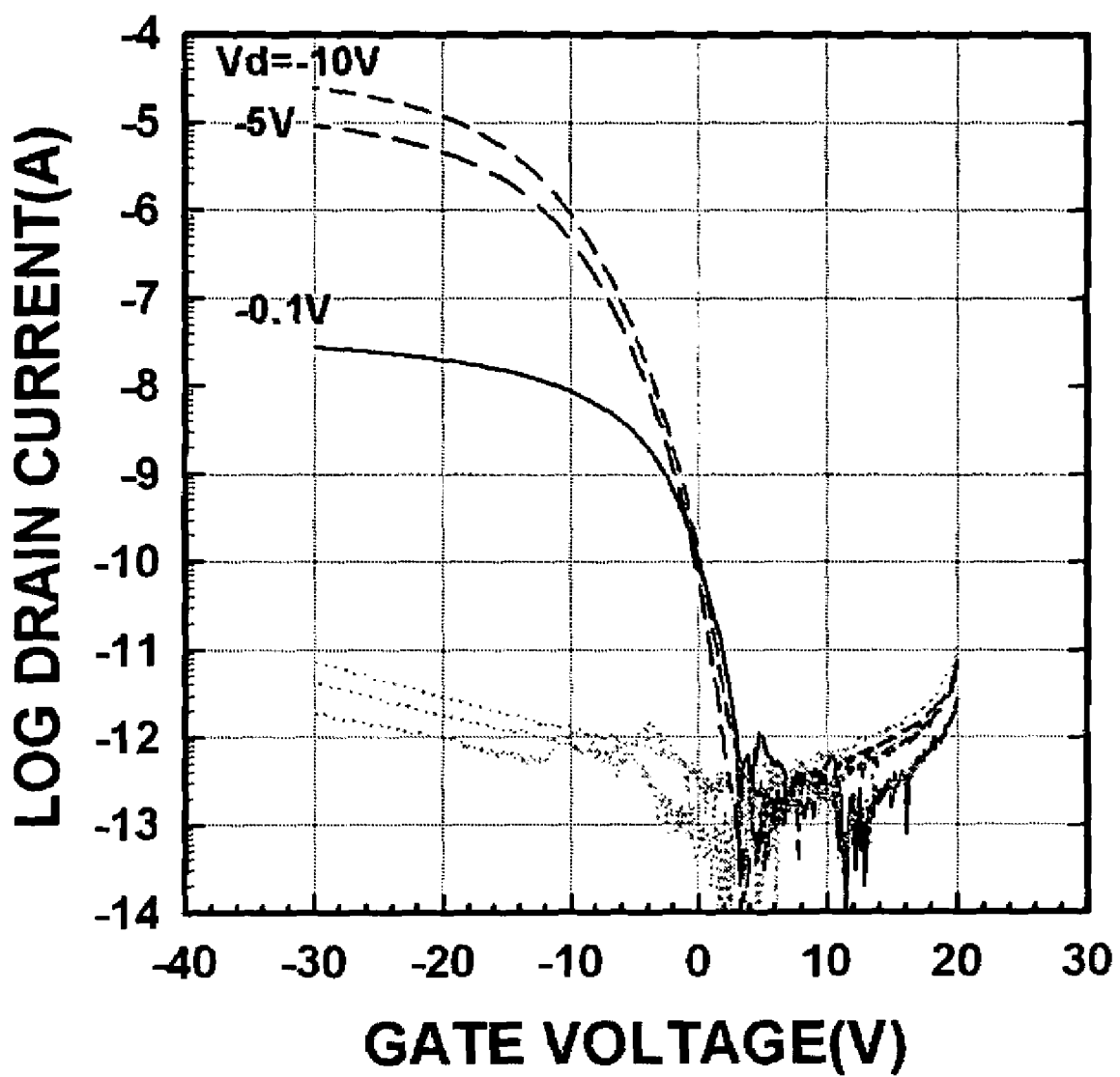
FIG. 12 is a graph showing transfer characteristic curve of an organic semiconductor thin film transistor according to the present invention.
Figure 13:
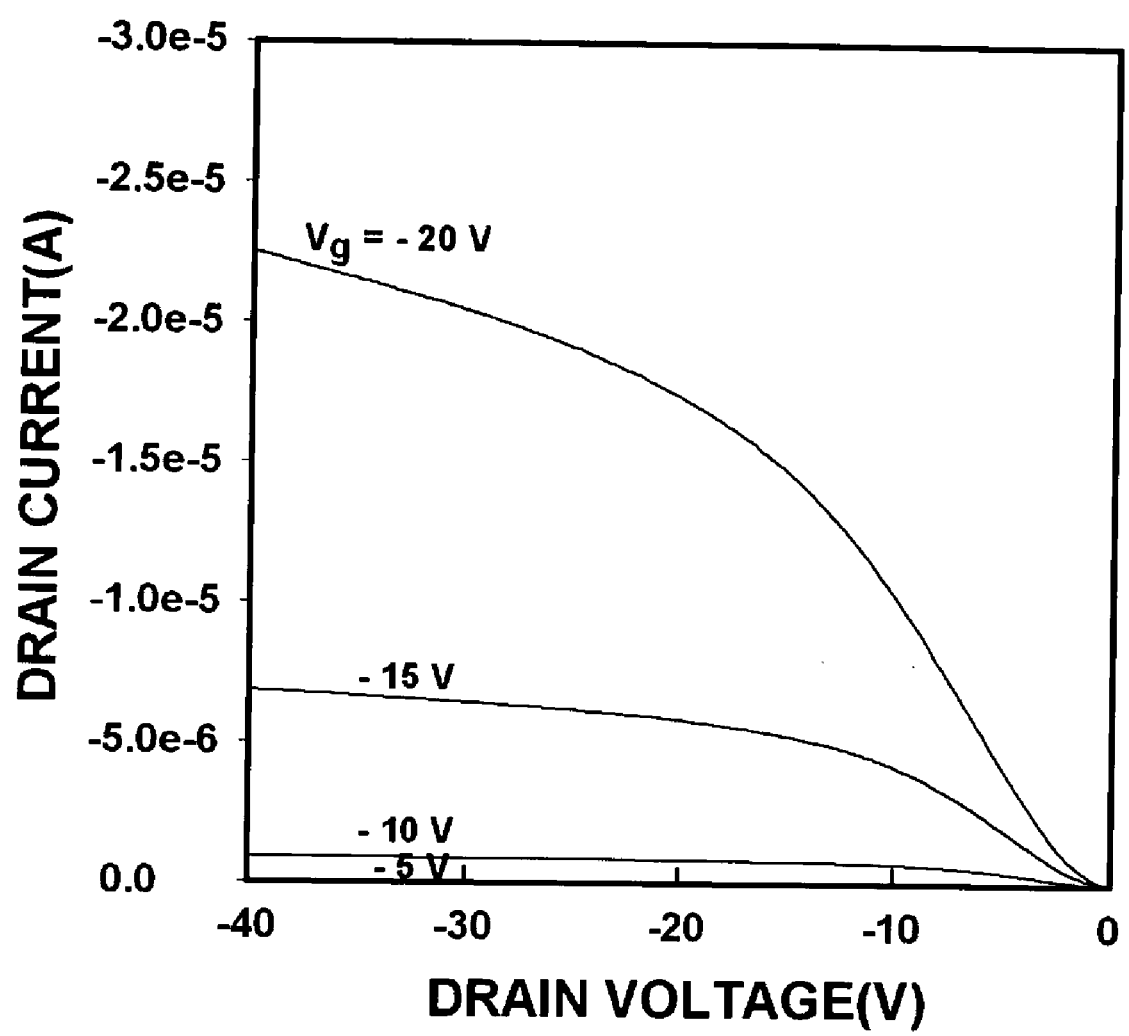
FIG. 13 is a graph showing output characteristic curves of an organic semiconductor thin film transistor according to the present invention.
Figure 14:
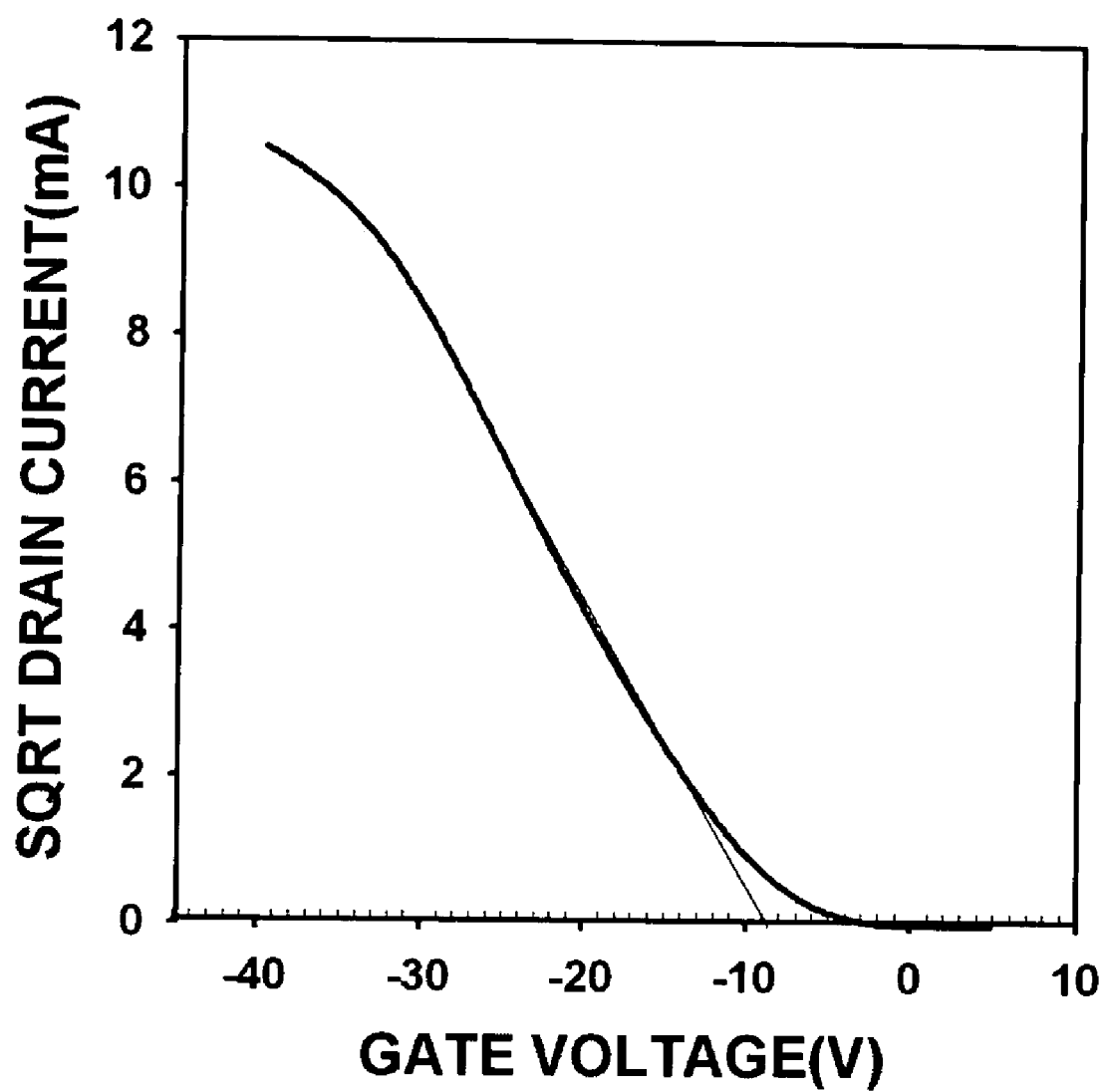
FIG. 14 is a graph showing an operating characteristic curve of a threshold voltage and a field effect mobility of an organic semiconductor thin film transistor according to the present invention.

FIGS. 12 to 14 are graphs showing characteristic curves of an organic semiconductor thin film transistor in array according to the embodiments of the present invention. FIG. 12 is a graph showing transfer characteristic curves. FIG. 13 is a graph showing output characteristic curves. FIG. 14 is a graph showing an operating characteristic curve of a threshold voltage and a field effect mobility.

In the organic semiconductor thin film transistor array according to the embodiments of the present invention, the field effect mobility is 0.41 cm$^2$/Vs, the threshold voltage is −1 V, and the current ratio is $10^7$. Therefore, the organic semiconductor thin film transistor array has a relatively high performance compared to a conventional one.

INDUSTRIAL AVAILABILITY

Accordingly, a method of manufacturing a thin film transistor by selectively depositing an organic semiconductor material of the present invention has the following advantages. Firstly, the method is simple. The obtained thin film transistor has a high performance compared to an inorganic semiconductor thin film transistor.

In addition, since the organic semiconductor material has a good selective deposition, the obtained thin film transistor array has a higher resolution and clearer pattern as the pixel area being smaller.

In addition, it is possible to obtain a high capacitance by reducing a gap between a lower common electrode and a pixel electrode.

In addition, having a higher resolution than a conventional one, an organic semiconductor thin film transistor array according to the present invention can be widely used for scientific and commercial applications.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a thin film transistor array comprising switching thin film transistors, pixel electrodes, and connecting elements connecting the switching thin film transistors and the pixel electrodes, the method comprising steps of
    forming gate lines on a substrate;
    forming gate insulating film to cover the gate lines formed on the substrate;
    forming source and drain electrodes on the gate insulating film;
    performing locally a plasma process on a substrate having a hydrophobic area so as to define discrete hydrophilic and hydrophobic surfaces;
    forming a monolayer where a self-assembled monolayer is to be formed by exposing said hydrophilic and hydrophobic surfaces to a semiconductor vacuum deposition process such that an organic semiconductor material is only deposited as a semiconductor active layer having an island shape on a hydrophobic surface;
    forming a protective layer to cover the organic semiconductor island; and
    forming contact holes though the protective film.

2. The method according to claim 1, where the gate lines are made of aluminum or aluminum alloy.

3. The method according to claim 1, wherein the gate insulating film is made of an organic material.

4. The method according to claim 3, wherein the organic material is made of PVP (polyvinylphenol), BCB (benzocylobutene), or PI (polyimide).

5. The method according to claim 1 further comprising a step of forming a pixel electrode on the gate insulating film.

6. The method according to claim 5, wherein the pixel electrode is made of ITO or IZO.

7. The method according to claim 1 further comprising a step of maintaining temperature of the substrate in a range of 100 to 200° C., thereby selectively forming the organic semiconductor island on the source and drain electrodes.

8. The method according to claim 1 further comprising a step of performing a surface treatment on the substrate and selectively depositing pantancene between the source and drain electrodes without shadow mask.

9. The method according to claim 8, wherein the step of performing the surface treatment comprises steps of:
    performing a plasma process on the substrate; and
    forming a monolayer where a self assembled monolayer is to be formed.

10. The method according to claim 9, wherein the monolayer is OTS (octadecyltrichlorosilane).

11. The method according to claim 1, wherein the organic semiconductor island is made of pantacene.

12. The method according to claim 1 further comprising a step of forming a protective layer on the organic semiconductor island to prevent damage on crystal of the organic semiconductor island, wherein a protective layer is an organic semiconductor film or an organic insulating film.

13. The method according to claim 12, wherein the organic semiconductor film or the organic insulating film is formed by using a selective photolithography process.

* * * * *

UNITED STATES PATENT AND TRADEMARK OFFICE
CERTIFICATE OF CORRECTION

| | | |
|---|---|---|
| PATENT NO. | : 7,118,937 B2 | Page 1 of 1 |
| APPLICATION NO. | : 10/882933 | |
| DATED | : October 10, 2006 | |
| INVENTOR(S) | : Jang et al. | |

It is certified that error appears in the above-identified patent and that said Letters Patent is hereby corrected as shown below:

IN THE CLAIMS:

In Col. 10, Claim 1, line 12 "contact holes though the protective film" should read:

--contact holes through the protective film--

In Col. 10, Claim 7, line 27, "200° C.," should read:

--200° C,--

Signed and Sealed this

Ninth Day of January, 2007

JON W. DUDAS
*Director of the United States Patent and Trademark Office*